(12) United States Patent
Sakakura

(10) Patent No.: US 6,285,188 B1
(45) Date of Patent: Sep. 4, 2001

(54) SELF-SHIELDED COIL WITH NON-INDUCTIVE WINDING

(75) Inventor: Yoshitomo Sakakura, Nasu-Gun (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/257,238

(22) Filed: Feb. 25, 1999

(30) Foreign Application Priority Data

Feb. 25, 1998 (JP) .................................................. 10-043948

(51) Int. Cl.⁷ ....................................................... G01V 3/18
(52) U.S. Cl. ............................................................. 324/318
(58) Field of Search ............................................... 324/318

(56) References Cited

U.S. PATENT DOCUMENTS

| | | |
|---|---|---|
| 5,349,318 | 9/1994 | Knoue . |
| 5,708,360 * | 1/1998 | Yui et al. ............................. 324/318 |
| 5,830,142 * | 11/1998 | Kuhara ................................. 324/318 |
| 6,054,854 | 4/2000 | Kawamoto . |

OTHER PUBLICATIONS

Berry L.W. Chapman, "Practical Aspects of Shielded Gradient Design", International Society for Magnetic Resonance in Medicine, p. 943, 1995.

* cited by examiner

*Primary Examiner*—Hezron Williams
*Assistant Examiner*—Dixomara Vargas
(74) *Attorney, Agent, or Firm*—Nixon & Vanderhye P.C.

(57) ABSTRACT

Provided is a self-shielded gradient coil unit with no useless electromagnetic induction, which is capable of increasing the efficiency of shielding. The unit comprises an X-channel, Y-channel, and Z-channel gradient coil assemblies. Each of the X-, Y- and Z-channel gradient coil assemblies has a pair of a main coil and a shield coil. The main coil has a first patterned winding formed by a first conductive wire wound on a predetermined pattern, and the shield coil has a second patterned winding formed by a second conductive wire wound on the predetermined pattern. A shielding magnetic field provided by the shield coil preventing the gradient provided by the main coil from leaking out of the unit. At least one of the first and second conductive wires is divided at the predetermined pattern into a plurality of wires. Those divided wires (turns) are wound in parallel on the predetermined pattern to form a divided-turn structure and wound to provide a non-inductive winding against flux passing through a closed loop formed by the divided wires.

16 Claims, 15 Drawing Sheets

→ : SHOWS DIRECTIONS OF CURRENTS FLOWING ALONG SHIELD COIL.
--→ : SHOWS DIRECTIONS OF CURRENTS INDUCED ALONG CLOSED LOOP OF SHIELD COIL.
⊗ : SHOWS DIRECTIONS OF FLUX FROM MAIN COIL.

PRESENT INVENTION

PRESENT INVENTION

SELF-SHIELDED COIL WITH NON-INDUCTIVE WINDING

BACKGROUND OF THE INVENTION

The present invention relates to a self-shielded type of coil unit and an MRI (magnetic resonance imaging) system using the same, particularly to a self-shielded type of coil unit that comprises a main coil for providing a utilizable magnetic field of a desired spatial distribution and a shield, or screen, coil for providing a shielding magnetic field substantially preventing the field from leaking out of the unit.

Medical magnetic systems have various types of coil assemblies. Such coil assemblies include a first coil assembly for generating a static magnetic field, a second coil assembly for generating a field that corrects the static field in uniformity, a third coil assembly for generating gradient magnetic fields superposed on the static field, and a fourth coil assembly for transmitting and receiving RF signals.

Of these, as the gradient coil assembly, various types of shielded coil assemblies have been developed for preventing gradient fields from leaking outward therefrom. A coil assembly called self-shielded gradient coil (frequently referred to as TSGC: Twin Shielded Gradient Coil or ASGC; Actively Shielded Gradient Coil) is one type falling into such self-shielded types. The self-shielded type gradient coil assembly comprises two distinct components for each of X-, Y-, and Z-channels: a main, or primary, coil that provides pulsed gradient fields of spatially desired distributions; and a shield, or screen, coil disposed so as to surround the main coil. The shield coil is used to provide a shielding field that prevents most magnetic flux provided by the main coil from leaking onto surrounding conductive structures placed around the coil assembly. In consequence, gradient fields leaked from the coil assembly decrease, suppressing the influence of eddy currents due to the leaked field on images.

The efficiency of shielding obtained by the self-shielded gradient coil is decided by the number of turns of a shield coil (i.e., the number of windings). Both the main and shield coils should be connected to power supply taking into account demands from the configuration of power supply circuitry. Under such conditions, a preferred technique for connecting coils is that both the main and shield coils are mutually connected in series to receive in common current from a single power supply. When adopting such series connection, the number of turns of the shield coil is determined on the turn-arrangement relationship with the main coil. The efficiency of shielding is thus determined depending on the number of turns. It is impossible to raise the efficiency of shielding any more under such configuration.

To overcome this difficulty, a technique for raising the efficiency of shielding by altering the number of turns of a shield coil is proposed by a paper"practical aspects of shielded gradient design, Barry L.W. Chapman, SMRM, 943,1995." In this proposal, special conditions different from how to use inductance elements in the ordinary electric circuit are imposed on the coils. That is, for changing the number of turns of the shield coil, the amount of current flowing through the shield coil must be controlled. Specifically, a dummy resistor or shunt power source is coupled with the shield coil in parallel so that the current though the shield coil is controlled.

However, when using a dummy resistor for current control as above, the magnetic characteristics of the self-shielded gradient coil may change, because the resistance of the dummy resistor changes with changed temperatures. The efficiency of shielding realized by the shield coil is also fluctuated or decreased.

In particular, where current is changed time-dependently, the amounts of impedance are mutually changed between one branch circuit into which the shield coil is inserted and the other branch circuit into which the dummy resistor is inserted. This will cause the current through the former branch circuit with no shield coil inserted to be reluctant to flow. Therefore, for scanning on a pulse sequence requiring current pulses at a higher rate (for example, an ultra fast scanning sequence such as an EPI (echo planar imaging) method), following changes in current is difficult for magnetic fields generated from the shield coil, causing the waveforms of the generated magnetic fields to be curved. A configuration in which the dummy resistor is connected is not proper for scanning that has been getting faster and faster recently.

On one hand, for using the shunt power source connected in parallel with the shield coil, the greater a n amount of current providing to the shunt power source gets, the larger the size of the power supply to the assembly becomes, raising cost in production. It is also true that the configuration using the shunt power source is inappropriate for scanning on ultra fast pulse sequences, because response times thereof are relatively longer.

SUMMARY OF THE INVENTION

The present invention has been made in consideration with the above problems. An object of the present invention is to provide a self-shielded type of coil unit with no useless electromagnetic induction, which is capable of increasing the efficiency of shielding (i.e., enhancing shielding performance) without current-controlling elements, such as a dummy resistor or a shunt power source, additionally connected with the shield coil as in the conventional technique.

Another object of the present invention is to provide a self-shielded type of coil unit preferably incorporated in an MRI system, in which the coil unit is capable of increasing the efficiency of shielding (i.e., enhancing shielding performance) without current-controlling elements, such as a dummy resistor or a shunt power source, additionally connected with the shield coil as in the conventional technique, avoiding the entire coil unit from becoming large in size, and being adopted to ultra fast scanning such as an EPI method.

In order to achieve the objects, the present invention is configured as follows.

According to a first invention, there is provided a self-shielded coil unit comprising: a main coil having a first patterned winding formed by a first conductive wire wound on a predetermined pattern, and a shield coil having a second patterned winding formed by a second conductive wire wound on the predetermined pattern, a shielding magnetic field provided by the shield coil preventing a magnetic field provided by the main coil from leaking out of the unit, wherein at least one of the first and second conductive wire is divided at the predetermined pattern into a plurality of wires wound in parallel on the predetermined pattern to form a divided-turn structure and wound to provide a non-inductive winding against flux passing through a closed loop formed by the divided wires.

Therefore, in discreting an analytically-calculated ideal continuous function for a desired spatial current distribution by turns of a wire, the adoption of the divided-turn structure enables a higher density of turns. This makes it possible to smooth an actual continuous function produced by the turns compared to that conventionally obtained, getting nearer to the ideal continuous function. Thus a highly accurate magnetic field distribution can be obtained. Additionally, thanks to an increase in spatial densities of turns (wires) wound around a bobbin, spacings between the turns can be narrowed, avoiding or suppressing the leakage of magnetic flux.

Moreover, the closed loop formed by a plurality of divided wires (turns) is formed into a non-inductive winding structure. Electromotive forces are induced as if inductive currents flowed along the closed loop due to magnetic flux from the self- and other channels, but they can be eliminated and remarkably suppressed by a non-inductive winding confirmation, before actually induced. Thus, the electromotive force due to such disturbances (unwanted magnetic flux) is almost completely or substantially removed from the closed loop, suppressing a useless oscillating magnetic field. In addition to the fact it is unnecessary to also use current control elements such as a dummy resistor or shunt power source, the efficiency of shielding (shielding performance) can be improved remarkably, artifacts of MR images can be suppressed, and ultra fast imaging based on an EPI method or others can be performed.

Preferably, the divided-turn and non-inductive structures are applied to the shield coil. It is also preferred that the unit is formed by a plurality of channels (e.g., X, Y and Z) for generating the magnetic field, a combination of the main and shield coils is installed for each channel, and each of the shield coils of the plurality of channels has a non-inductive winding structure against the magnetic field provided by its own main coil.

It is also preferred that the unit is formed by a plurality of channels for generating the magnetic filed, a combination of the main and shield coils is installed for each channel, and each of the shield coils of the plurality of channels has a non-inductive winding structure against the magnetic field provided by the other-channel main coil.

Still, it is preferred that the unit is formed by a plurality of channels for generating the magnetic field, a combination of the main and shield coils is installed for each channel, and each of the shield coils of the plurality of channels has the non-inductive winding structure against the magnetic field provided by both the self-channel and other-channel main coils.

The above configuration of the coil unit can be incorporated in a self-shielded gradient coil unit for a magnetic resonance imaging system.

Thus a second invention is a self-shielded gradient coil unit for magnetic resonance imaging, in which a three orthogonal X-, Y-, and Z-axes direction is set for generating a gradient in each axis direction, the unit comprising: an X-channel gradient coil assembly for providing a gradient in the X-axis direction; a Y-channel gradient coil assembly for providing a gradient in the Y-axis direction; and a Z-channel gradient coil assembly for providing a gradient in the Z-axis direction, wherein each of the X-, Y- and Z-channel gradient coil assembly has a pair of a main coil and a shield coil, the main coil having a first patterned winding formed by a first conductive wire wound on a predetermined pattern, and the shield coil having a second patterned winding formed by a second conductive wire wound on the predetermined pattern, and a shielding magnetic field provided by the shield coil preventing the gradient provided by the main coil from leaking out of the unit, and wherein at least one of the first and second conductive wire is divided at the predetermined pattern into a plurality of wires wound in parallel on the predetermined pattern to form a divided-turn structure and wound to provide a non-inductive winding against flux passing through a closed loop formed by the divided wires.

In this configuration, for example, the divided-turn and non-inductive structures are applied to the shield coil and the number of divided wires are two in number.

Preferably, the shield coil of each of the X- and Y-channels has two pairs of the second patterned windings arranged face to face about a center axis of a bobbin on and around which the shield coil is wound, each of the two pairs of second patterned windings being arranged in series along an axial direction of the bobbin, each of the second patterned windings being formed into a saddle-like winding in which the second conductive wire is wound on a spiral pattern as the predetermined pattern and is directed in opposite ways to each other between the second predetermined windings forming one pair, and the second conductive wire of each saddle-like winding has the divided-turn structure, the divided wires positioning in the spiral pattern being exchanged every saddle-like winding constituting each pair of windings.

It is preferred that one divided wire of each of the four saddle-like windings constituting the two pairs of patterned windings is electrically connected in series with each other and the other divided wire thereof is electrically connected in series with each other, and the two sets of series-connected divided wires are electrically connected in parallel with each other.

It is also preferred that the patterned windings of both the shield coil and the main coil are electrically connected in series and receives the same power supply.

In the case of the Z-channel, the shield coil thereof has a single pair of the second patterned windings arranged in series along an axial direction of a bobbin on and around which the second conductive wire is wound on a solenoid-like pattern as the predetermined pattern and is directed in opposite ways to each other between the second predetermined windings forming the pair, and the second conductive wire of each patterned winding has the divided-turn structure, the divided wires positioning in the solenoid pattern being exchanged with regard to the axial direction of the bobbin between the patterned winding constituting each pair of windings.

The remaining features of the invention will be clearly understood from the following description of preferred embodiments and their modifications, described together with accompanying drawings.

DESCRIPTION OF THE PREFERRED EMBODIMENTS

Referring to the accompanying drawings, embodiments of the present invention will now be described.

First Embodiment

Referring to FIGS. 1 to 10, a first embodiment of the present invention will be described.

In this embodiment, the present invention is described concerning each shield coil of X-, Y- and X-channel coil assemblies of a self-shielded type of gradient coil unit, referred to as a TSGC (Twin Shielded Gradient Coil or an ASGC (Actively Shielded Gradient Coil), of an MRI (magnetic resonance imaging) system.

Figure 1:
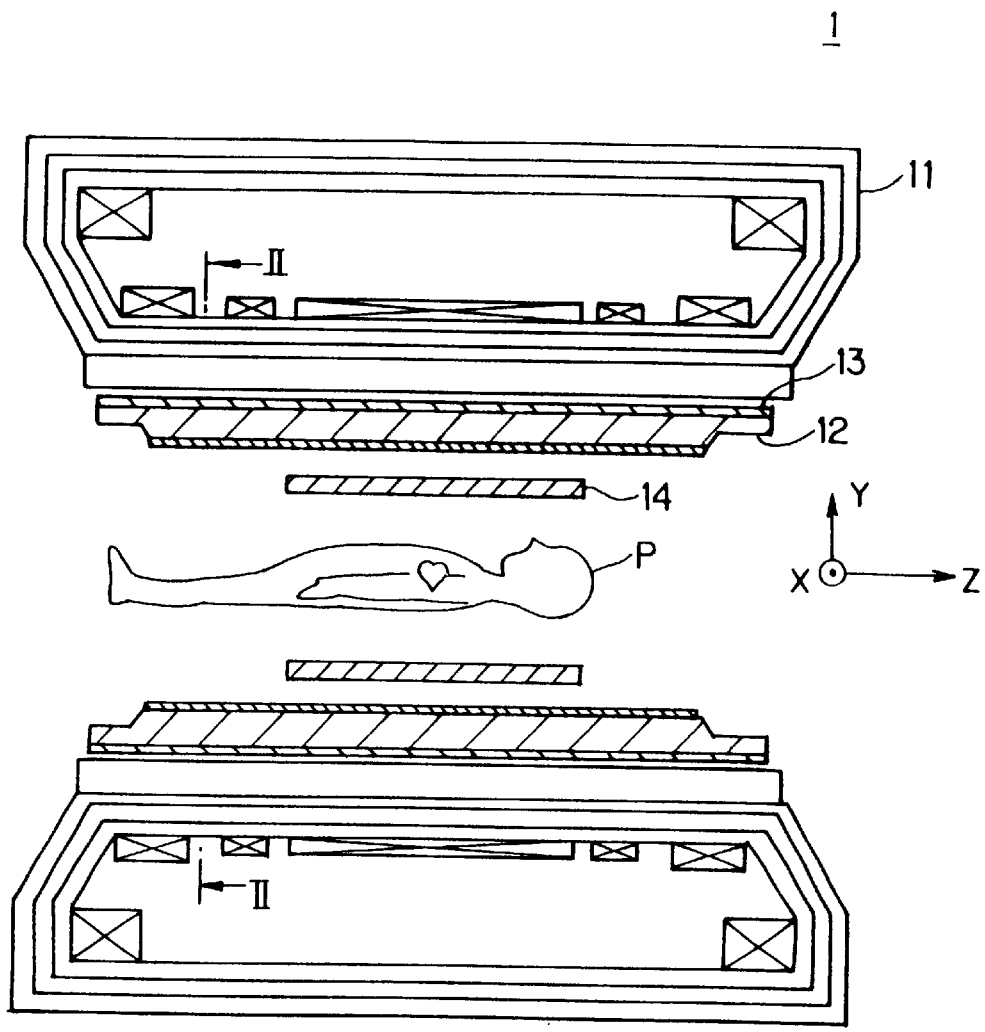
FIG. 1 is an outlined schematic view of a gantry of an MRI system in which a self-shielded gradient coil according to the present invention is installed.

FIG. 1 exemplifies a longitudinally sectioned configuration outlining a gantry 1 of the MRI system. The gantry 1 is generally shaped into a cylindrical structure having a cylindrical bore that serves as a space for scanning. A patient P is inserted into the bore for scanning.

The gantry 1 has an approximately cylindrical coil unit 11 for providing a static magnetic field, an approximately cylindrical coil unit 12 disposed within a bore of the coil unit 11, a shim coil unit placed, for example, on around the outer surface of the unit 12, and an RF coil disposed within a bore of the coil unit 12. The coil unit 12 is a self-shielded gradient coil unit 12 for providing gradient magnetic fields (gradients). A patient P is laid on a not-shown couchtop to be delivered into the bore formed by the gradient coil unit 12.

A superconductive magnet forms the static field coil unit 11, for instance. The magnet has an outermost vacuum container in which a plurality of heat radiation shield containers and a single liquid helium container are placed. A superconductive coil is placed in the liquid helium container.

The gradient coil unit 12 is formed into a self-shielded type of coil unit in this embodiment. To generate pulsed gradients in each of the X-, Y- and Z-axis directions physically set in the gantry 1, the coil unit 12 has each coil assembly for each channel. Each coil assembly is formed into a shielded structure that almost prevents each gradient field from leaking outward.

Figure 2:
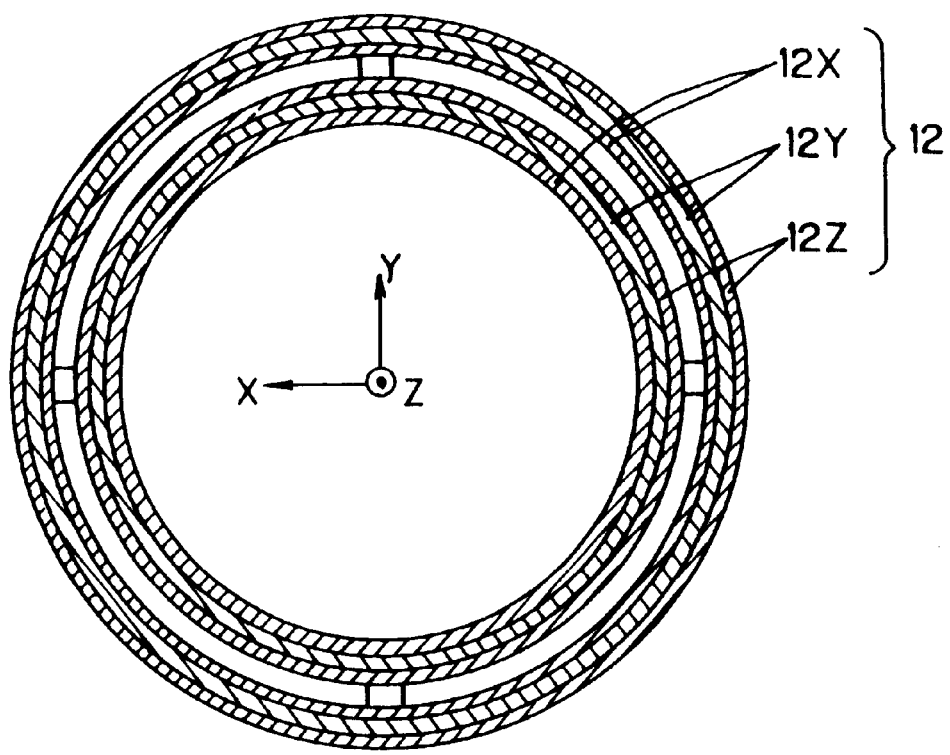
FIG. 2 is a schematic sectional view sectioned along a II—II line in FIG. 2, showing a section of the orthogonal to the Z-axis thereof.

In practical, the gradient coil unit 12 has, as shown in FIG. 2, an X-ch coil assembly 12X, a Y-ch coil assembly 12Y, and a Z-ch coil assembly 12Z entirely formed into a cylindrical shape, in which coil layers constituting the coil assemblies are stacked one on another with insulation layers intervened therebetween. Each coil assembly 12X, 12Y or 12Z comprises a main, or primary, coil and a shield, or secondary or screen, coil. The main coil includes a plurality of patterned windings generating gradients in each direction. The shield coil includes a plurality of patterned windings shielding the gradient pulses generated by the windings of the main coil so as to prevent them from leaking out of the coil assembly.

Figure 3:
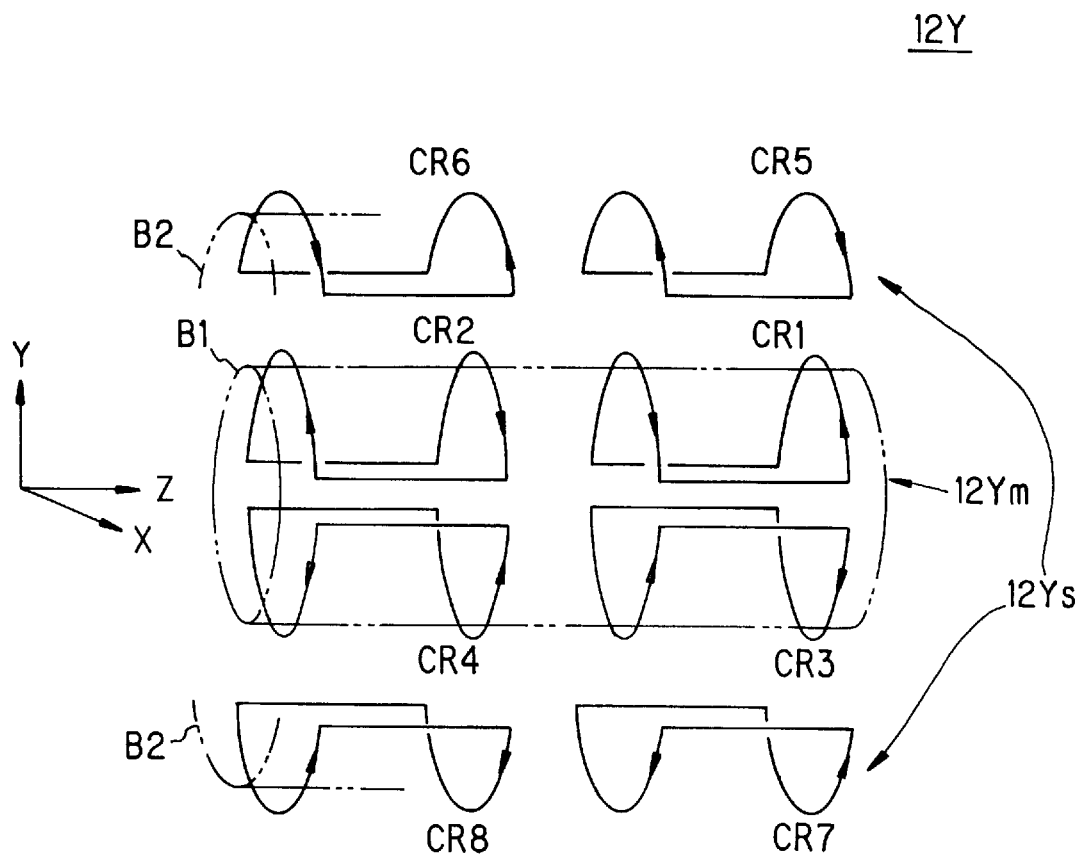
FIG. 3 illustrates the arrangement of windings for a main and shield coils in the Y-channel of the self-shielded gradient coil.

Of these, the Y-ch coil assembly 12Y comprises a main coil 12Ym and a shield coil 12Ys both made up from a flat conductive wire. The main coil 12Ym includes four saddle-like patterned windings CR1 to CR4 in each of which the wire is wound along a spiral form on around a bobbin B1 of a predetermined diameter. The patterned windings CR1 and CR2 are arranged in series in the Z-direction and electrically connected in series to each other. Such a pair of patterned windings is also arranged at the opposite position of this pair about the Z-axis so as to be faced to each other, becoming a pair of patterned windings CR3 and CR4. Pulsed currents provided to the patterned windings CR1 to CR4 are directed, as shown by arrows in the figure, to be opposite to each other between the faced windings and between adjacent windings, so that gradients in the Y-axis direction can be changed linearly in the magnitude. In FIG. 3, a divided turn structure is omitted from being drawn, which will be described later in FIG. 6.

On one hand, the shield coil 12Ys comprises four saddle-like patterned windings CR5 to CR8 in each of which the wire is wound along a spiral form on around a bobbin B2 larger in diameter than the bobbin B1. The patterned windings CR5 and CR6 are arranged in series in the Z-direction and electrically connected in series to each other. Such a pair of patterned windings is also arranged at the opposite position of this pair about the Z-axis so as to be faced to each other, becoming a pair of patterned windings CR7 and CR8. Pulsed currents provided to the patterned windings CR5 to CR8 are directed, as shown by arrows in the figure, to be opposite to the corresponding windings of the main coil 12Ym when viewed along the Y-direction, so that the gradients in the Y-axis direction can be changed linearly in the magnitude.

In FIG. 3, each saddle-like pattern winding is pictorially shown in a simplified form by employing only a spirally wound one turn. Actually each patterned winding consists of a plurality of turns spirally wound. The bobbins B1 and B2 are stacked on insulation layers on which other channels of coil assemblies are placed.

The X-ch coil assembly 12X is arranged in the same manner as the Y-ch coil assembly 12Y, but rotated 90 degrees in the circumferential direction about the Z-axis.

Figure 6:
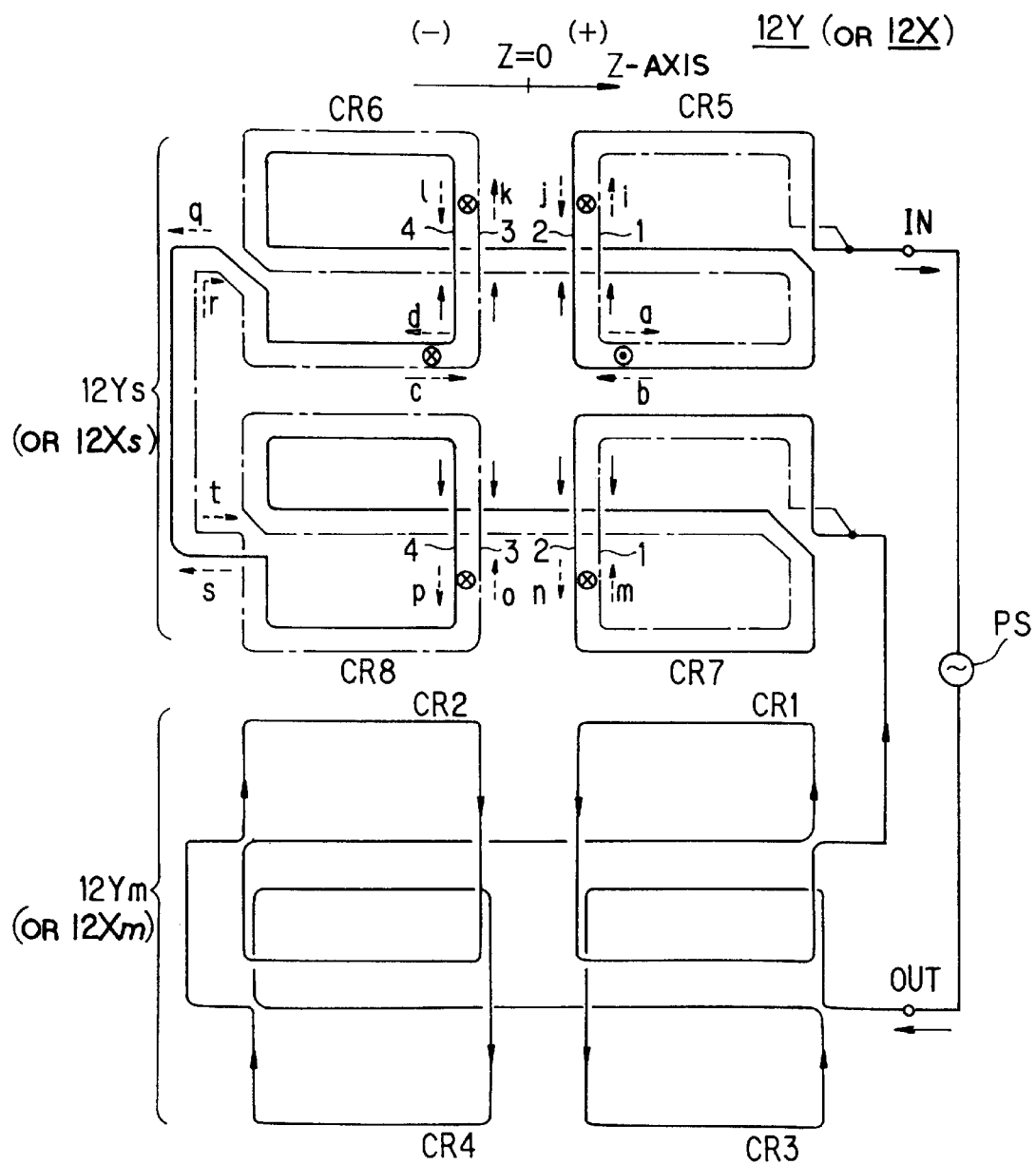
FIG. 6 is an exploded planar view of eight windings of the shield coil for the Y-channel of the self-shielded gradient coil according to a first embodiment of the present invention.

The foregoing X-ch and Y-ch coil assemblies 12X and 12Y adopt a winding structure and a connection technique both featuring the present invention, which will be detailed later in FIG. 6.

Figure 4:
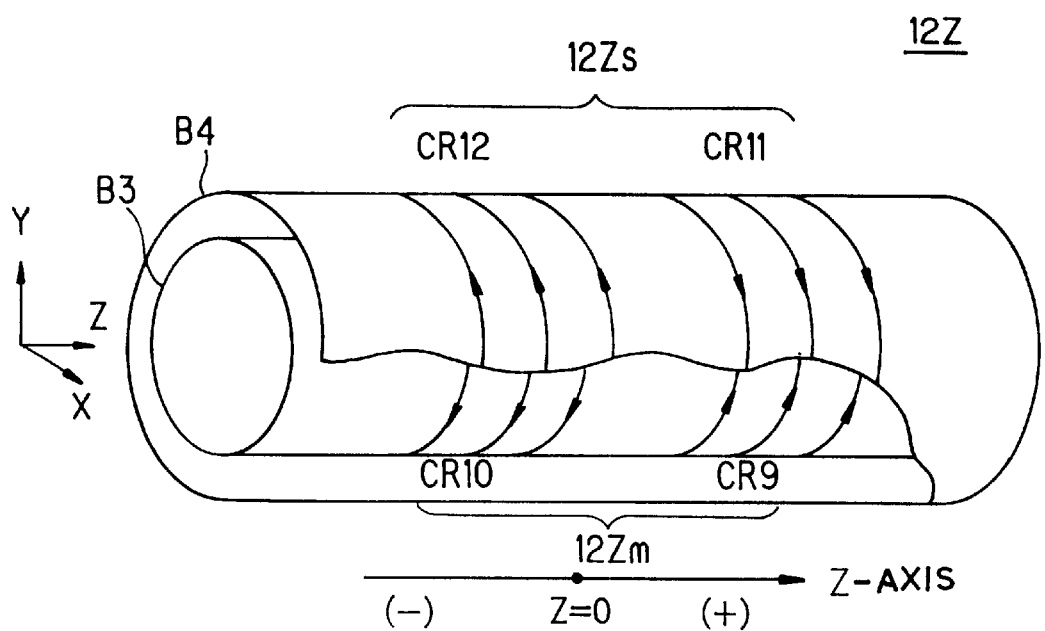
FIG. 4 illustrates the arrangement of windings for a main and shield coils in the Z-channel of the self-shielded gradient coil.

Furthermore, the Z-ch coil assembly 12Z is outlined in FIG. 4. This assembly 12Z has a main coil 12Zm and a shield coil 12Zs formed with a flat plate-like wire wound on around a bobbin B3 by a plurality of tuns. The main coil 12Zm is wound on around the cylindrical bobbin B3 along a predetermined solenoid-like pattern. The shield coil 12Zs is wound in the same way around a bobbin B4 larger in diameter than the bobbin B3. In each of the coils 12Zm and 12Zs, the wound wire is reversed into the opposite winding direction at the center Z=0 in the Z-axis direction. In FIG. 4, like FIG. 3, drawing a divided turn structure is omitted; the divided turn will be shown in FIG. 7.

The above coil assemblies 12x, 12Y and 12Z include a winding structure featuring the present invention, respectively.

Figure 5:
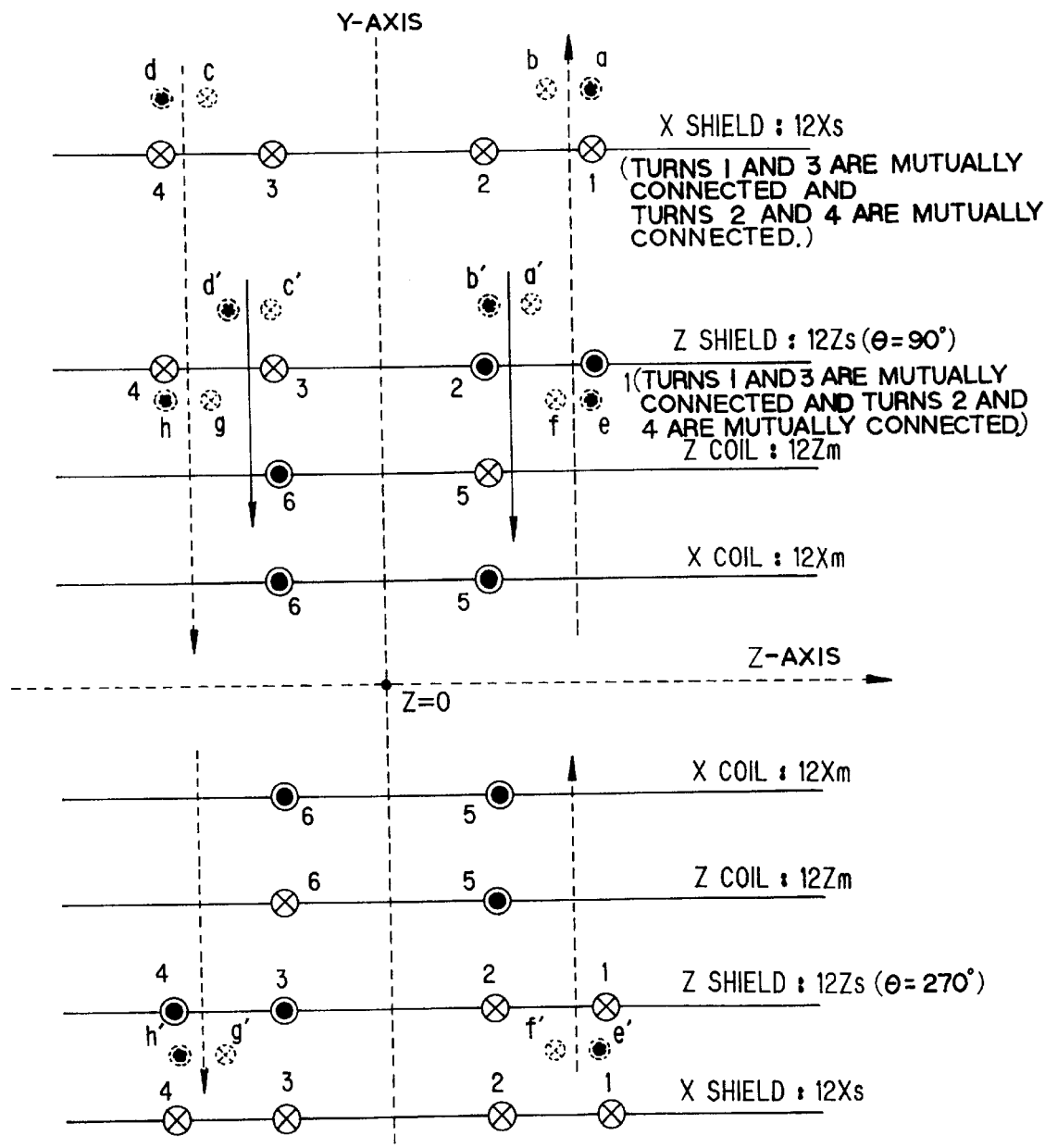
FIG. 5 is an illustration theoretically explaining part of connections of turns achieving non-inductive winding according to the present invention.

The principle of this winding structure is partly shown in FIG. 5. This structure is made up of two types of winding referred to as a"divided-turn structure (refer to FIGS. 6 and 7)" and a "non-inductive winding structure." The turn-divided structure allows a single wire constituting at least part of a patterned winding of a coil assembly to be divided into a plurality of wires wound around a bobbin in parallel to each other. The non-inductive winding structure permits the divided wires to be wound around the bobbin in a non-inductive fashion. In this embodiment, both the divided-turn structure and the non-inductive winding structure are applied to the shield coil of each channel.

The divided-turn structure is based on a theory that increasing densities in spatial distributions of turns can more steadily prevent the leakage of magnetic flux from, for example, a shield coil. However, when a single wire is divided into plural ones (for example, two) and those are simply wound around a bobbin in parallel to each other, the divided wires form a closed loop between patterned windings. If magnetic flux generated either the self-channel and/or other channels interlinks with this closed loop, an inductive current flows along the closed loop on account of inductive electromotive force. This inductive current has influence on an original coil current for a desired gradient, resulting in, for example, deterioration of shielding performance by the shield coil (namely, deterioration of performance of the gradient coil unit and cause of artifacts of MR images).

Therefore, the present invention employs a wire connecting method illustrated in FIG. 5, where the lateral axis shows positions in the Z-axis direction and the longitudinal axis positions in the radial Y-axis direction. FIG. 5 pictorially shows a connection that makes it possible to avoid only the mutual induction phenomenon caused between the X-ch and Z-ch coil assemblies, but this connection is also applied to the relationship between the Y-ch and Z-ch coil assemblies.

In terms of illustration, as shown in FIG. 5, the X-ch main coil 12Xm, Z-ch main coil 12Zm, Z-ch shield coil 12Zs and X-ch shield coil 12Xs can be placed in each of the upper and lower parts of FIG. 5 centered by the Z-axis. And, in each part, the coils may be drawn in the order of 12Xm, 12Zm, 12Zs and 12Xs, starting from a radial position near to the X-axis. Thus, provided representative turns 1 to 4 (for shield coils) and 5 and 6 (for main coils), it is reasonable that the currents flowing through those turns can be directed as shown in the figure. Referring to FIG. 6, it is understood that the turns 1 and 2 represent divided turns by which the shield coil of each channel is divided into two wires in one sided Z-directional region (Z>0), whilst the turns 3 and 4 represent divided turns by which the shield coil of each channel is divided into two wires in the other sided Z-directional region (Z<0). In the figure, dotted straight lines pictorially show the directions of fields produced by the X-ch main coil 12Xm and solid straight lines do those produced by the Z-ch main coil 12Zm.

(1): First, using the coil arrangement shown in the upper part sectioned by the Z-axis in FIG. 5, a connection relationship between patterned windings will be described in order to accomplish the non-inductive winding against induction with the self channel.

(1-1): For example, in the case of the X-channel, magnetic flux from its main coil 12Xm interlinks a closed loop (refer to FIG. 6) formed by the divided turns of its shield coil 12Xs. Thus, along the closed loop formed by the divided turns 1 and 2, and 3 and 4 of the shield coil 12Xs, electromotive forces are induced as if inductive currents flowed in the directions shown by current flow arrows a and b, and c and d. Taking into account of those directions, one turn 1 belonging to the (+)Z-axis directional region is electrically connected to one turn 3 to the (−)Z-axis directional region, while the other turn 2 to the (+)Z-axis directional region is electrically connected to the other turn 4 to the (−)Z-axis directional region. One current a flowing along the one turn 1 in the (+)Z-axis directional region, which passes from the rear of the drawing paper to the front thereof, and another current c flowing along another turn 3 in the (−) Z-axis directional region, which passes from the front of the drawing paper to the rear thereof, meet with each other along the windings, i.e., their flowing directions are opposite to each other. Also, this holds true of the divided turns 2 and 4. Electromotive forces are induced as if inductive currents flowed along the closed loop made in both the plus- and minus-sides by the divided turns of the shield coil 12Xs, but they will be canceled out with other, causing no inductive current therealong. The influence of induction currents can be avoided almost completely.

(1-2): This theory can totally be applied to the Y-channel, and providing the identical non-inductive function to the above. (1-3): In the case of the Z-channel, magnetic flux from its main coil 12Zm interlinks a closed loop (refer to FIG. 7) formed by the divided turns of its shield coil 12Zs. Thus, along the closed loop formed by the divided turns 1 and 2, and 3 and 4 of the shield coil 12Zs, electromotive forces are induced as if inductive currents flowed in the directions shown by current flow arrows a' and b', and c' and d'. Taking into account of those directions, one turn 1 belonging to the (+)Z-axis directional region is electrically connected to one turn 3 to the (−)Z-axis directional region, while the other turn 2 to the (+)Z-axis directional region is electrically connected to the other turn 4 to the (−)Z-axis directional region. For this Z-channel, one current a' flowing along the one turn 1 in the (+)Z-axis directional region, which passes from the rear of the drawing paper to the front thereof, and another current c' flowing along another turn 3 in the (−) Z-axis directional region, which passes along the same way as that for the above current a' toward the drawing paper, meet with each other along the windings, i.e., their flowing directions are opposite to each other. Also, this holds true of the divided turns 2 and 4. Electromotive forces are induced as if inductive currents flowed along the closed loop made in both the (+)Z- and (−)Z-sides by the divided turns of the shield coil 12Zs, but they will be canceled out with other, causing no inductive current therealong. The influence of induction currents can be avoided almost completely.

(2): Secondly, using the coil arrangement shown in the lower part sectioned by the Z-axis in FIG. 5, a connection relationship between patterned windings will be described in order to accomplish the non-inductive winding against induction with the other one or more channels.

(2-1): For the Z-channel, in addition to magnetic flux generated by the main coil 12Zm (i.e., self channel), magnetic flux generated by both the X- and Y-channels (i.e., other channel) interlinks with the closed loop formed by the divided turns of the shield coil 12Zs. For example, due to magnetic flux generated by the X-channel, electromotive forces are induced as if inductive currents flowed along the turns 1 to 4 of the Z-ch shield coil 12Zs from two locations where the magnetic flux enter and exit into and from the closed loop. In other words, as regarding the divided turns 1 and 2 formed in the (+)Z-side of the shield coil 12Zs, electromotive forces are induced as if inductive currents flowed not merely along current flow symbols e an f at a first given-angle position ($\theta$=90 degrees, for example) but also along current flow symbols e' and f' at a second facing-angle position ($\theta$=270 degrees, for example) 180 degrees apart from the first given-angle position. As understood from this, for each of the divided turns 1 and 2, the directions of the inductive currents at the second angle position are opposite to those at the first angle position, current being canceled out by themselves.

The same is applied to the divided turns 3 and 4 positioned in the (−)Z-axis side of the shield coil 12Zs. As for the divided turns 3 and 4, electromotive forces are induced as if inductive currents flowed not merely along current flow symbols g an h at a first given-angle position ($\theta$=90 degrees, for example) but also along current flow symbols g' and h' at a second facing-angle position ($\theta$=270 degrees, for example) 180 degrees apart from the first given-angle position. As understood from this, for each of the divided turns 3 and 4, the directions of the inductive currents at the second angle position are opposite to those at the first angle position, current being canceled out by themselves.

As a result, inductive currents resulting from the other X- and Y-channels are not induced through the closed loop formed by the divided turns of the Z-ch shield coil 12Zs because of the cancellation of inductive currents are realized turn by turn.

(2-2): Furthermore, the non-inductive winding of the Y-channel (or X-channel) against magnetic flux generated from the Z-channel is achieved by the connection between two pairs of patterned windings CR1 and CR2, and CR3 and CR4 faced to each other, as will be described later.

Figure 7:
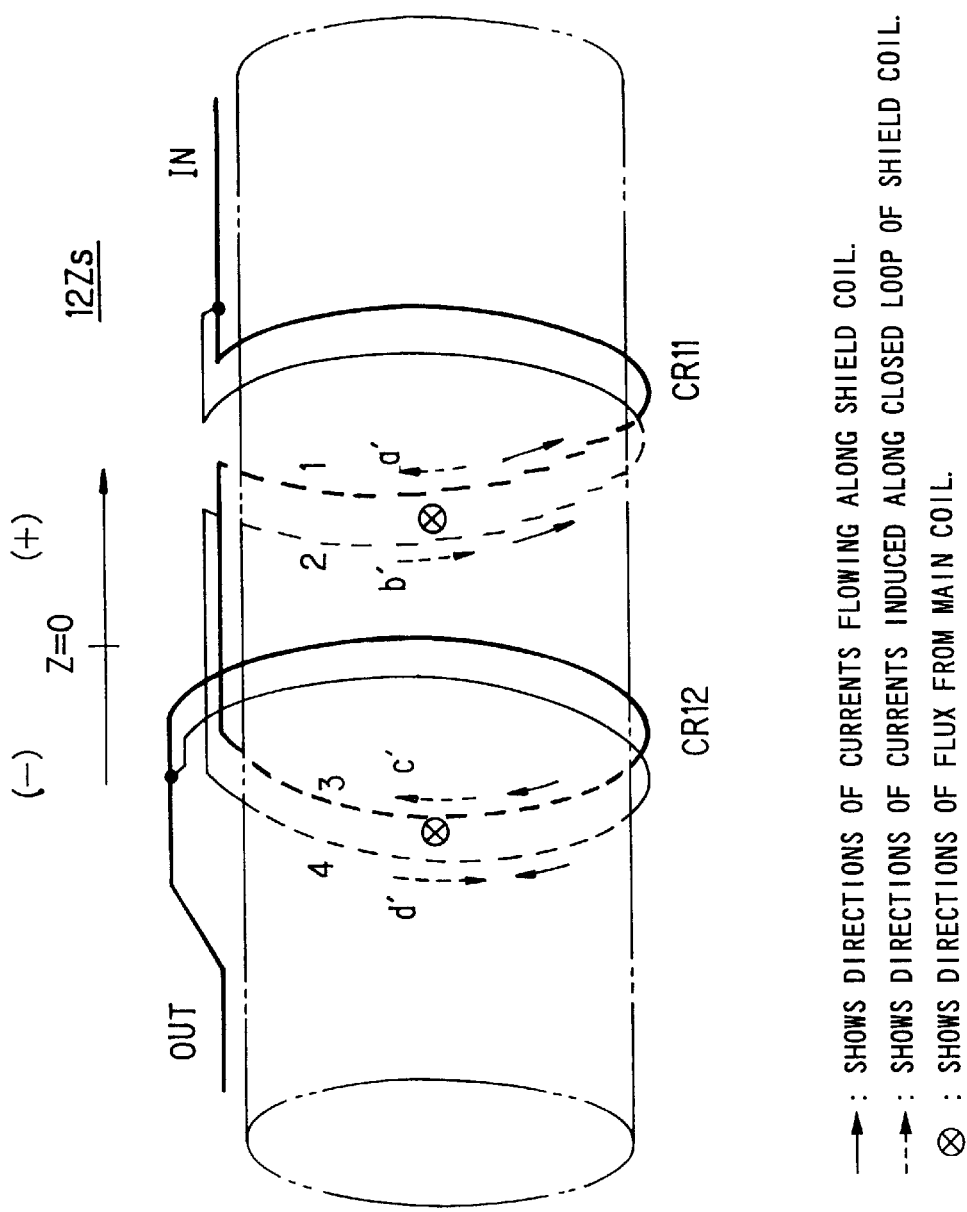
FIG. 7 is an illustration pictorially shows two turns of a pair of windings of the Z-channel of the self-shielded gradient coil.

In this embodiment, the above principle for connecting the patterned windings is adopted. Thus, the Y-channel (or X-channel) coil assembly is connected as shown in FIG. 6, while the Z-channel coil assembly is connected as shown in FIG. 7.

For the Y-channel (or X-channel), the patterned windings CR1 to CR4 of the main coil 12Ym and those CR5 to CR8 of the shield coil 12Ys are electrically connected in series, and receive power from the same pulsed power supply PS. The pulsed power supply PS is turned on or off in response to a pulse sequence signal not shown here. As a result of it, currents for generating both gradients and a shielding magnetic field flow as shown by solid arrows in FIG. 6. Of the patterned windings CR1 to CR8, those CR5 to CR8 of the shield coil 12Ys are formed with the "divided-turn structure", as pictorially shown therein. The divided-turn structure uses, for example, two plate-like divided conductors formed by cutting a plate conductor at the center in its lateral width along its longitudinal direction. The two divided conductors are wound in a spiral form on a saddle surface of the bobbin B2. The current (for example, 100[A]) for generating a shielding magnetic field flows so as to be divided into each divided turn (current is divided into 50[A] each) at the divided point, increasing a spatial current density on the windings of the shield coil.

Moreover, when considering one pair of patterned windings CR5 and CR6, it is found that the wires are arranged so as to change running lanes. One divided turn 1 (shown by the one-dotted line) that runs along the inner lane of one patterned winding CR5 is connected to one divided turn 3 of the other patterned winding CR6, which runs along the outer lane thereof. On the contrary, the other divided turn 2 (shown by the solid line) that runs along the outer lane of one patterned winding CR5 is connected to the other divided turn 4 of the other patterned winding CR6, which runs along the inner lane thereof. These connections for the turns 1 to 4 agree with the foregoing principle, items (1-1) and (1-2). Thus, against magnetic flux generated by the main coil 12Ym (or 12Xm) of the self-channel, electromotive forces are induced to make inductive currents flow, as shown by one-dotted lines a to d in FIG. 6. Specifically, inductive currents a and c, if they flow actually, are the same in amount and opposite in direction to each other, and inductive currents b and d behave in the same way, if they occur. The same analysis as the above can be done for the other pair of patterned windings CR7 and CR8. Therefore, a conclusion is that magnetic flux due to the self-channel main coil 12Ym (or 12Xm) causes no inductive current in its shield coil 12Ys (or 12Xs).

When considering the induction of the Z-channel against the X- and Y-channels is not covered by only a pair of patterned windings. However, in FIG. 6, for example, the outer-lane positioned divided turn 3 of the patterned winding CR6 belonging to one pair of patterned windings is connected with the outer-lane-positioned divided turn 3 of the patterned winding CR8 belonging to the other pair of patterned windings. The electromotive forces resulting from magnetic flux from the Z-channel are directed to induce currents shown by dotted line arrows i to p in FIG. 6. Those inductive currents between the two pairs of patterned windings can be expressed by dotted line arrows q to t, which are the same in magnitude but opposite in direction between the two pair of patterned windings. Therefore, the electromotive force caused by one pair of patterned windings CR5 and CR6 encounters that caused by the other pair of those CR7 and CR8, resulting in cancellation almost completely. No inductive current will be caused through the shield coil 12Ys (or 12Xs).

For the Z-channel, as shown in FIG. 7, the patterned windings CR9 to CR10 (not shown in FIG. 7) of the main coil 12Zm and those CR11 to CR12 of the shield coil 12Zs are electrically connected in series, and receive power from the same pulsed power supply (not shown). The pulsed power supply is turned on or off in response to a pulse sequence signal not shown here. As a result of it, currents for generating a shielding magnetic field flow as shown by solid arrows in FIG. 6. Of the patterned windings CR9 to CR12, those CR11 and CR12 of the shield coil 12Zs are formed with the "divided-turn structure", as pictorially shown therein. The divided-turn structure uses, for example, two plate-like divided conductors formed by cutting a plate conductor at the center in its lateral width along its longitudinal direction. The two divided conductors are wound in a solenoid form on a saddle surface of the bobbin B4. Thus, also for the Z-channel, the current for generating a shielding magnetic field flows so as to be divided into each divided turn at one divided point, increasing a spatial current density of the windings of the shield coil.

Moreover, when considering the patterned windings CR11 and CR12, it is found that the wires are arranged so as to change running lanes. One divided turn 1 that runs along the axial outer lane of one patterned winding CR11 in the (+)Z-axis range is connected to one divided turn 3 of the other patterned winding CR12 in the (−)Z-axis range, which runs along the axial center-side lane thereof. On the contrary, the other divided turn 2 that runs along the axial center-side lane of one patterned winding CR11 in the (+)Z-axis range is connected to the other divided turn 4 of the other patterned winding CR12 in the (−)Z-axis range, which runs along the axial outer lane thereof. These connections for the turns 1 to 4 agree with the foregoing principle, item (1-3). Thus, against magnetic flux generated by the main coil 12Zm of the self-channel, electromotive forces are induced to attempt to produce inductive currents flow, as shown by dotted arrows a' to d' in FIG. 7. Specifically, inductive currents a' and c', if they flow actually, are the same in amount and opposite in direction to each other, and inductive currents b' and d' behave in the same way, if they occur. Therefore, a conclusion is that magnetic flux due to the self-channel main coil 12Zm causes no inductive current in its shield coil 12Zs.

In this Z-channel, against magnetic flux generated from the X- and Y-channels, the non-inductive winding structure is employed based on the foregoing principle, item (2–1), causing no inductive currents.

Additionally, no inductive current is caused between the X- and Y-channels, because the X- and Y-channels are arranged 90 degrees apart around the Z-axis and have the identical coil arrangement patterns to each other.

Figure 8:
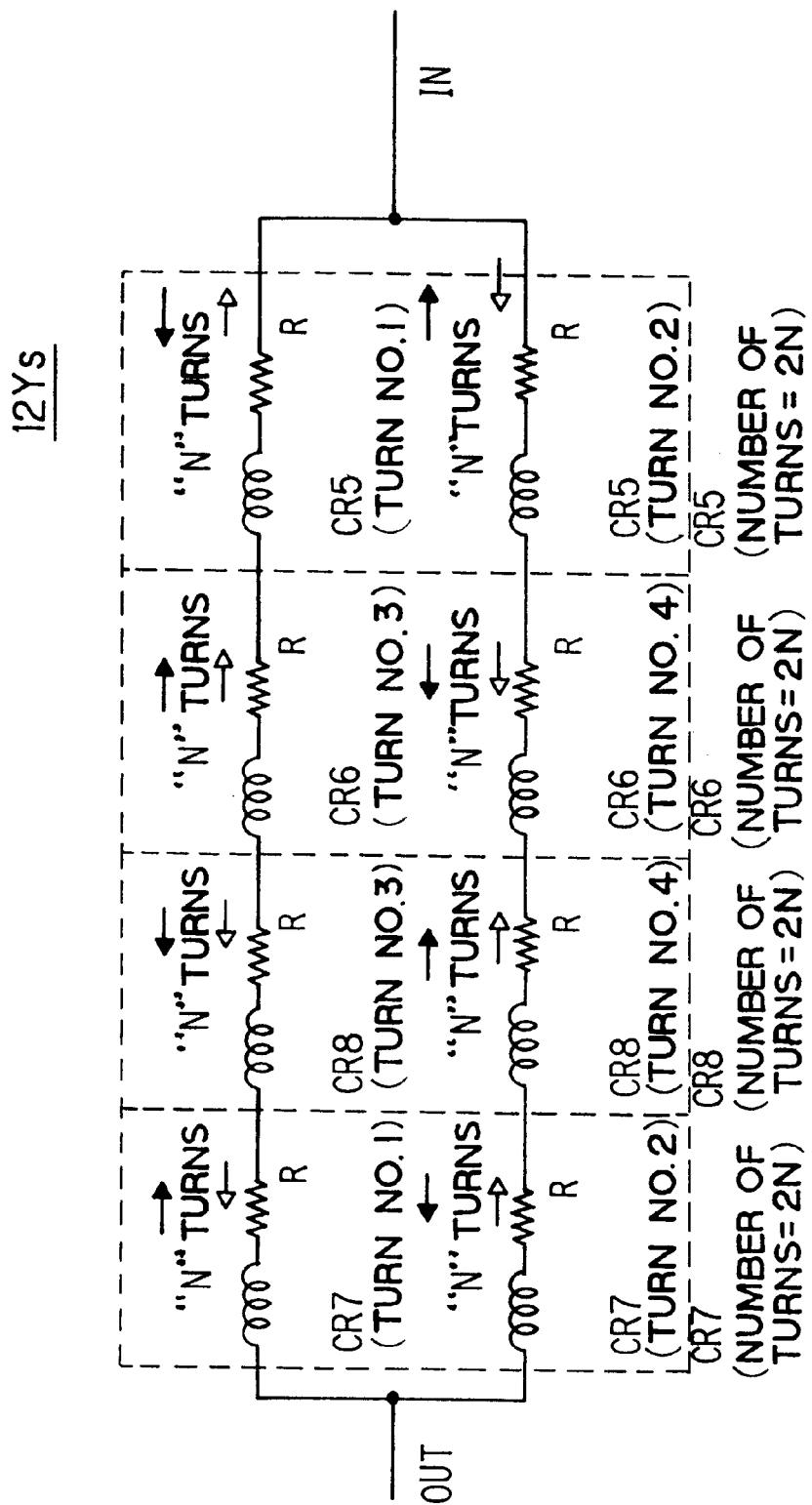
FIG. 8 is an electrically equivalent circuit diagram of the shield coil for the Y-channel of the self-shielded gradient coil.

FIG. 8 shows an equivalent circuit diagram for the shield coil 12Ys to which the divided-turn and non-inductive winding structures are applied. As shown therein, a total of series-connected four turns 1, 3, 3 and 1 of the patterned windings CR5 to CR8 and a total of series-connected four turns 2, 4, 4 and 2 of the patterned windings CR5 to CR8 are connected in parallel in the equivalent circuit. In this figure, black arrows represent inductive currents due to flux interlinked from the main coil of the self-channel, and white arrows do inductive currents due to flux interlinked from the Z-channel considered the other channel. The inductive currents are proportional in magnitude to the number of turns of each patterned winding. The electromotive forces arise to cancel inductive currents to each other, inductive currents due to flux from each X-, Y-, or Z-channel are no longer generated. This operation is applied to the X-channel.

Figure 9:
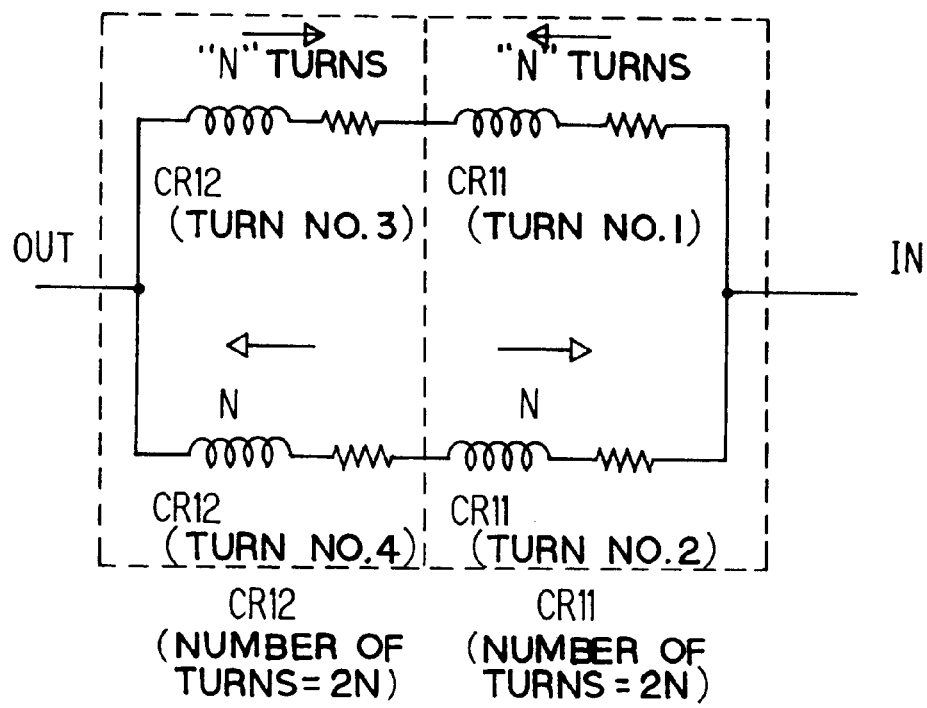
FIG. 9 is an electrically equivalent circuit diagram of the shield coil for the Z-channel of the self-shielded gradient coil.

FIG. 9 shows an equivalent circuit diagram for the shield coil 12Zs to which the divided-turn and non-inductive winding structures are applied. As shown therein, a total of series-connected two turns 1 and 3 of the patterned windings CR11 and to CR12 and a total of series-connected two turns 2 and 4 of the patterned windings CR11 to CR12 are connected in parallel in the equivalent circuit. In this figure, the arrows represent inductive currents due to flux interlinked from the main coil of the self-channel. The inductive currents are proportional in magnitude to the number of turns of each patterned winding. The electromotive forces arise to cancel inductive currents to each other, inductive currents due to the Z-channel itself are no longer generated. In this occasion, no inductive current due to flux from the X- and Y-channels flows either.

Figure 10A:
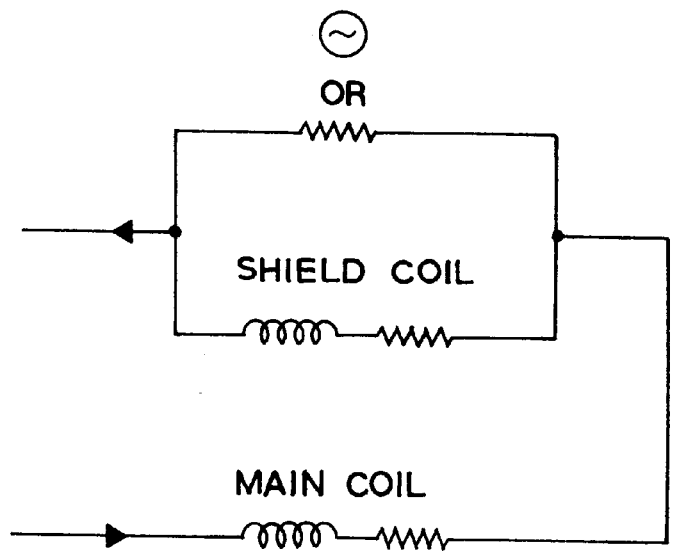
FIG. 10A is an electrically equivalent circuit diagram showing one conventional shield coil cited for comparison with the present invention.
Figure 10B:
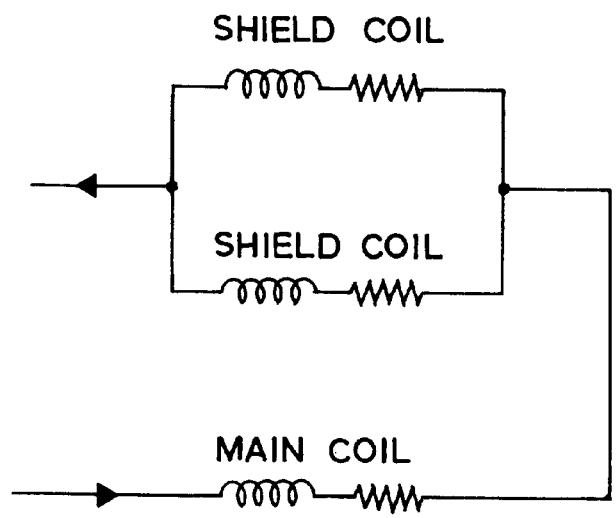
FIG. 10B is an electrically equivalent circuit diagram showing a typical example of the shield coil according to the present invention.

Comparing the concept for the shield coil of the present invention described above to that of the paper described before, they can be shown as in FIGS. 10A and 10B. FIG. 10A represents an electrical equivalent circuit to the foregoing conventional circuit, in which a dummy resistor or a shunt power source is connected to the shield coil. In contrast, FIG. 10B represents another electrical equivalent circuit to the present invention, in which the divided turn and non-inductive structures are incorporated into the shield coil.

According to this embodiment, the divided-turn structure raises a spatial density distribution of shielding current, thereby increasing the efficiency for shielding. Namely, compared to the conventional type, stream functions having denser and finer step-like current distributions can be obtained. The stream functions nearer to an ideal stream function analytically obtained can be provided, enabling MR imaging to be carried out in a highly accurate fashion. The more the number of divided turns is, the less coarseness in discrete coil arrangement is, providing ones getting near to an ideal stream function.

In addition, the shield coil of the individual X-, Y-, and Z-channels are formed so as to be non-inductive against the self- and other channels. Electromotive forces are induced by the electromagnetic inductive phenomenon as if inductive currents flowed along the closed loop formed by the divided turns of the shield coil, but they are steadily suppressed to almost zero. This means that all the gradient channels can operate independently from each other.

Therefore, unlike the conventional technique, it is unnecessary that current control elements, such as a dummy resistor or shunt power source, should be additionally arranged to the shield coil of a self-shielded gradient coil unit of an MRI system. With the entire size of the unit avoided from becoming large, no affection is given due to useless electromagnetic induction, increasing the efficiency for shielding (that is, shielding performance) of the shield coil and providing the self-shielded gradient coil unit preferred to ultra fast scanning on an EPI pulse sequence or others.

Figure 11A:
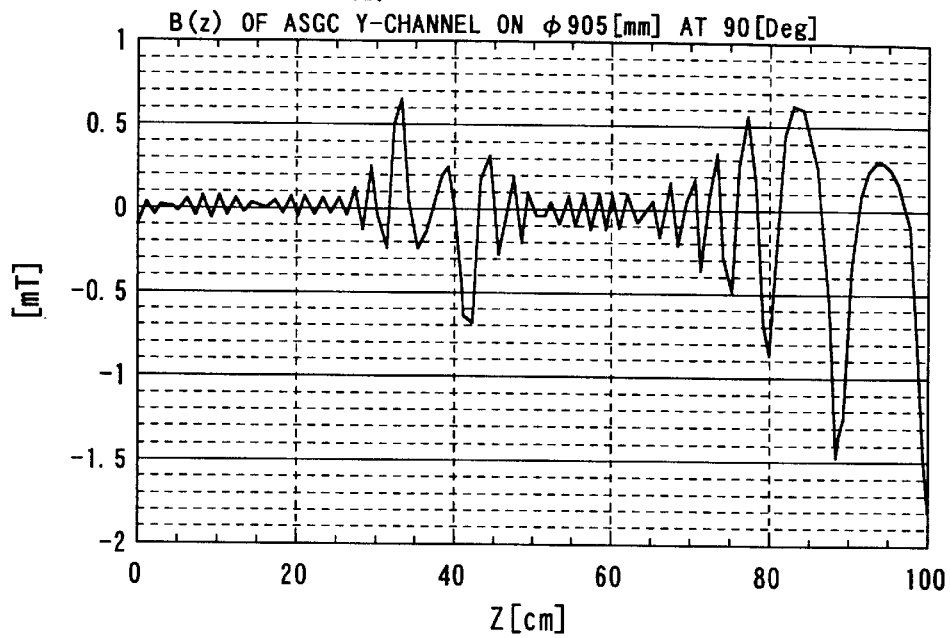
FIG. 11A is a chart showing the result simulated according to a conventional technique and showing the amplitude of leaked magnetic flux.
Figure 11B:
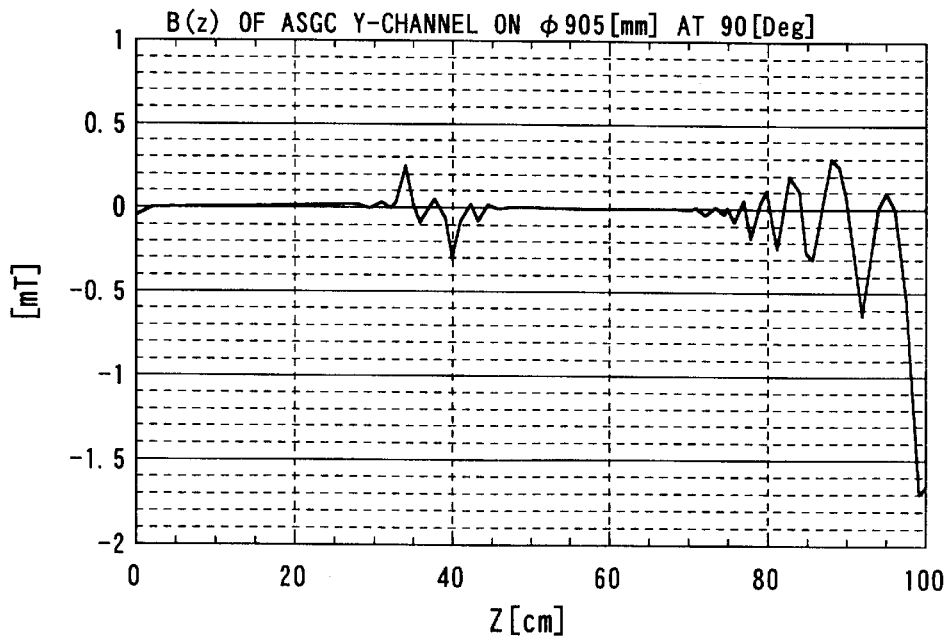
FIG. 11B is a chart showing the result simulated according to the present invention technique and showing the amplitude of leaked magnetic flux.

FIGS. 11A and 11B show simulation results for confirming the advantages brought by the present invention. Of the charts shown, FIG. 11A is a chart, which is conducted based on the conventional technique, that shows the magnitude of leaked magnetic flux B(z)[mT] of a Y-channel self-shielded gradient coil at each location along half the Z-axis direction. No divided-turn structure is employed; namely the number of windings per turn is one. A simulated location in the radial direction is at half the bore diameter of a gantry (i.e., 905[mm]/2) and in the circumference direction at an angle position of 90 degrees about the Z-axis. The sectional size of a wire (i.e., turn) is 5.189 mm in width by 5.189 mm in height in a rectangular shape. Current supplied is 200[A]. Additionally, a static magnet covers only a range up to approximately Z=80[cm], so it should be considered that positions beyond the range Z=80[cm] are not our target.

On one hand, FIG. 11B is another chart, which is conducted based on the present invention technique, that shows the magnitude of leaked magnetic flux B(z)([mT] of a Y-channel self-shielded gradient coil at each location along half the Z-axis direction. The divided-turn structure is employed, of which number of windings per turn is two. The other simulating conditions are the same as the above.

It is clearly shown that the leaked flux amounts B(z) shown in the FIG. 10B chart are remarkably smaller and less fluctuated than that shown in FIG. 10A chart. Thus, it can be concluded that the present invention technique is superior to the conventional one, and is able to provide the foregoing various advantages.

Second Embodiment

Figure 12:
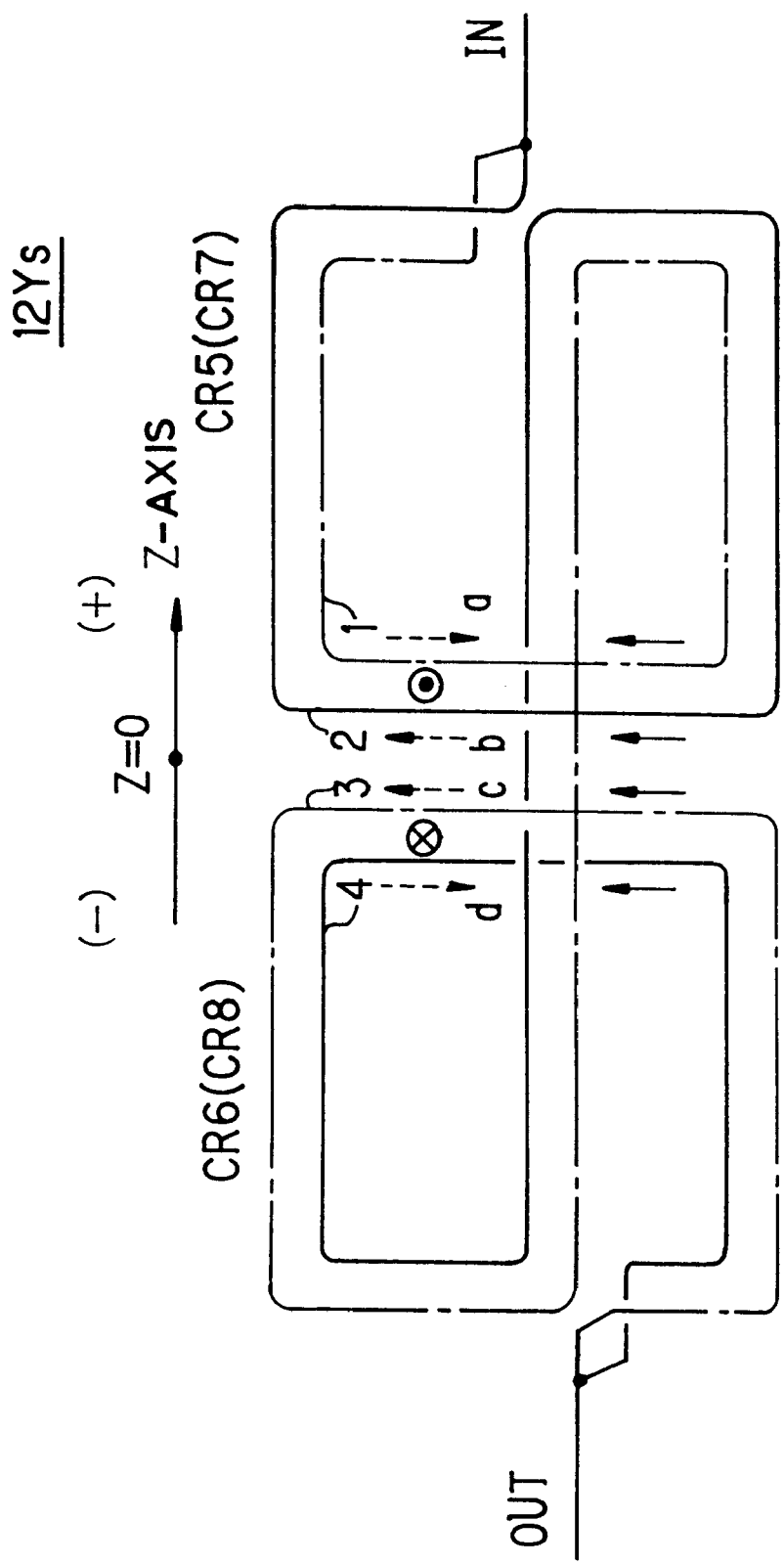
FIG. 12 is an exploded planar view showing windings of the shield coil for the Y-channel of the self-shielded gradient coil according to a second embodiment of the present invention.

Referring to FIG. 12, a second embodiment of the present invention will be described.

A Y-ch shield coil 12Ys shown in FIG. 12 is able to realize the divided-turn structure and the non-inductive winding structure for the self-channel using only either one pair of patterned windings CR5 and CR6, or, CR7 and CR8. The wiring is identical to that described in FIG. 6, but the divided turn is completed with this pair only. This enables the non-inductive winding of a main coil of the self-channel, avoiding or suppressing useless electromagnetic induction as well, and improving shielding performance.

Third Embodiment

Figure 13:
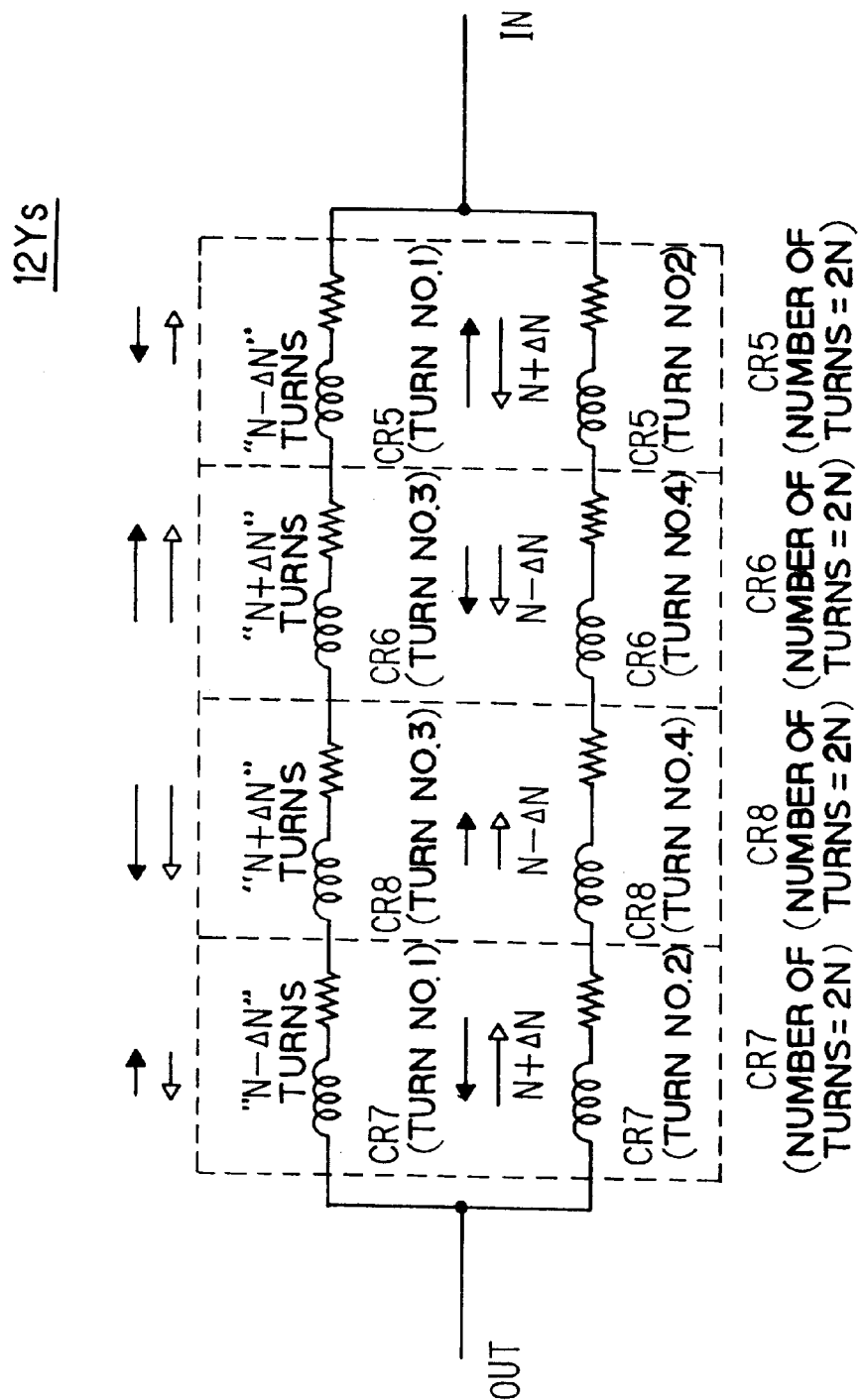
FIG. 13 is an electrically equivalent circuit diagram showing the shield coil for the Y-channel of the self-shielded gradient coil according to a third embodiment of the present invention.

Referring to FIG. 13, a third embodiment of the present invention will be described.

In the present invention, for a shield coil having the divided-turn structure, as understood from the equivalent circuit shown in FIG. 8, it is enough if the entire closed loop will cause no inductive current. Hence, the individual patterned windings CR5 to CR8 do not quire to be always equal in the number of turns to each other.

FIG. 13 shows an electrical equivalent circuit of the Y-ch shield coil 12Ys incorporated in a self-shielded gradient coil unit, of which the number of turns are altered based on this concept. The shield coil can be applied to the X-channel.

As shown therein, a total of series-connected four turns 1, 3, 3 and 1 of the patterned windings CR5 to CR8 and a total of series-connected four turns 2, 4, 4 and 2 of the patterned findings CR5 to CR8 are electrically connected in parallel. In this figure, black arrows represent inductive currents due to flux interlinked from the main coil of the self-channel, and white arrows do inductive currents due to flux interlinked from the Z-channel considered the other channel. The inductive currents are proportional in magnitude to the number of turns of each patterned winding. With the number of turns of each of the patterned windings CR5 to CR8 kept equal, the number of turns in each patterned winding that forms the divided turns is turn by turn increased or decreased by $\Delta N$, providing the turns of "N+$\Delta N$" or "N−$\Delta N$" ($0 \leq \Delta N < N$). Hence, since the entire patterned windings can cancel out inductive currents, no inductive current is caused.

Fourth Embodiment

Figure 14:
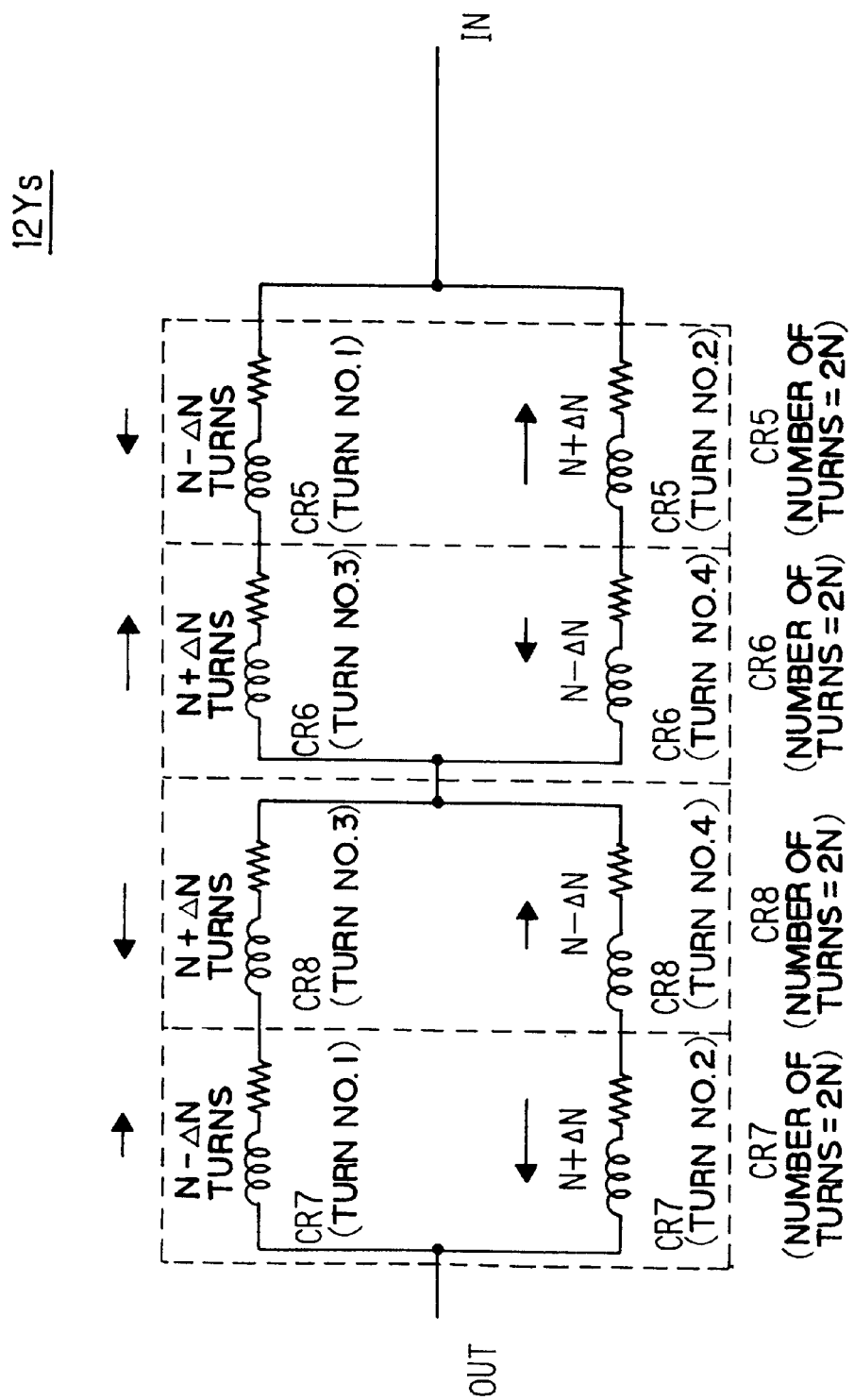
FIG. 14 is an electrically equivalent circuit diagram showing the shield coil for the Y-channel of the self-shielded gradient coil according to a fourth embodiment of the present invention.

Referring to FIG. 14, a fourth embodiment of the present invention will be described.

This embodiment is concerned with a modification of the configuration shown in FIG. 12, in which the number of turns is altered every divided turn of each patterned winding. This configuration is shown in regard to the Y-channel, but is also applicable to the X-channel.

As shown therein, from an electrical circuitry viewpoint, a total of series-connected two turns 1 and 3 of the patterned windings CR5 and CR6 and a total of series-connected two turns 2 and 4 of the patterned windings CR5 and CR6 are electrically connected in parallel. Also, a total of series-connected two turns 3 and 1 of the patterned windings CR8 and CR7 and a total of series-connected two turns 4 and 2 of the patterned windings CR8 and CR7 are electrically connected in parallel. Further those parallel circuits are coupled in series with each other. In this figure, the arrows represent inductive currents due to flux interlinked from the main coil of the self-channel. The inductive currents are proportional in magnitude to the number of turns of each patterned winding. With the number of turns of each of the patterned windings CR5 to CR8 kept equal, the number of turns in each patterned winding that forms each divided turn is turn by turn increased or decreased by AN, providing the turns of "N+$\Delta N$" or "N−$\Delta N$" ($0 \leq \Delta N < N$). Hence, since the entire patterned windings can cancel out inductive currents, no inductive current is caused. Incidentally, when $\Delta N=0$, a resultant circuit corresponds to that described in the second embodiment.

The shield coil described in this embodiment does not provides the non-inductive winding against the Z-channel employed as the other channel, but still provides such winding against the self channel. Hence, if a gradient coil unit is designed to cause only inductive currents of relatively smaller magnitudes, this embodiment is still effective.

Fifth Embodiment

Figure 15:
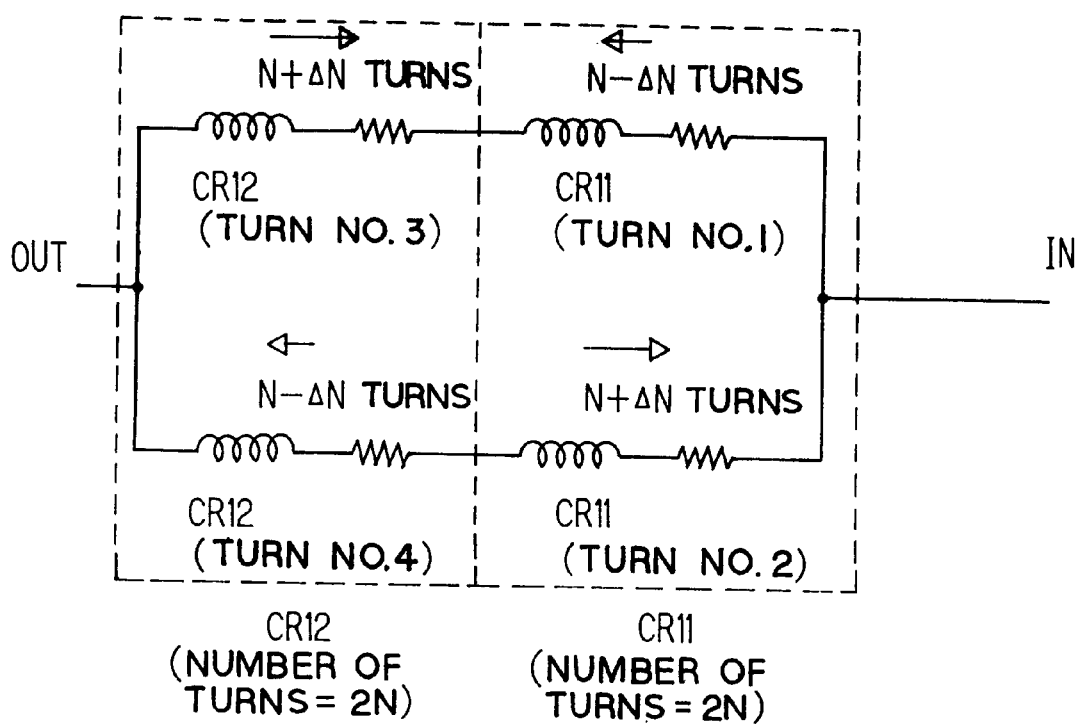
FIG. 15 is an electrically equivalent circuit diagram showing the shield coil for the Z-channel of the self-shielded gradient coil according to a fifth embodiment of the present invention.

Referring to FIG. 15, a fifth embodiment of the present invention will be described.

This embodiment is concerned with a modification of the configuration of the Z-channel shown in the first embodiment, in which the number of turns of its shield coil is altered every divided turn of each patterned winding.

As shown therein, from an electrical circuitry viewpoint, a total of series-connected two turns 1 and 3 of the patterned windings CR11 and CR12 and a total of series-connected two turns 2 and 4 thereof are electrically connected in parallel. In this figure, the arrows represent inductive currents due to flux interlinked from the main coil of the self-channel (Z-channel). The inductive currents are proportional in magnitude to the number of turns of each patterned winding. With the number of turns of each of the patterned windings CR11 and CR12 kept equal, the number of turns in each of the patterned windings that forms divided turns is turn by turn increased or decreased by $\Delta N$, providing the turns of "N+$\Delta N$" or "N−$\Delta N$" ($0 \leq \Delta N < N$). Hence, since the entire patterned windings can cancel out inductive currents, no inductive current is caused. Incidentally, when $\Delta=0$, a resultant circuit corresponds to that described in the first embodiment.

The non-inductive winding is realized against both the self- and other channels, providing the equivalent advantages to those described before.

This configuration having the divided-turn and non-inductive winding structures can be practiced to each of the X-, Y- and Z-channels.

By the way, the number of divided turns for the divided-turn structure applicable to the present invention is not restricted to two, but three or more divided turns are available. As the number of divided turns is increased, a distribution of spatial current densities can be set in a finer fashion, improving shielding performance.

Furthermore, a magnetic-field generating coil practicable according to the present invention has no limitation on types (or shapes), such as cylindrical, face-to-face, surface, or open type.

The present self-shielded coil unit can be applied to systems other than medical MRI systems, if required.

Although the description above contains many specificities, these should not be construed as limiting the scope of the invention but as merely providing illustrations of some of the presently preferred embodiments of this invention. Thus the scope of this invention should be determined by the appended claims and their legal equivalents.

What is claimed is:

1. A self-shielded magnetic field coil unit comprising:

a main coil having a first patterned winding formed by a first conductive wire wound on a predetermined main coil pattern; and a shield coil having a second patterned winding formed by a second conductive wire wound on a predetermined shield coil pattern to suppress magnetic field leakage from the main coil out of the unit;

at least one of said first and second conductive wires being divided over substantially its entire length into a plurality of branch wires in a divided-turn structure that is also configured to be non-inductive with respect to magnetic flux passing through a closed loop formed by the parallel-connected branch wires.

2. A coil unit as in claim 1 wherein the plurality of branch wires for a coil are wound around a bobbin in parallel spatial relationship with each other.

3. A coil unit as in claim 1 wherein only the shield coil has the divided-turn non-inductive structure.

4. A coil unit as in claim 2 wherein:

the shield coil patterned winding includes plural pieces, and the non-inductive winding configuration is formed by connecting the plurality pieces so that currents induced b y flux passing through a closed loop of the divided-turn structure are cancelled as a whole in the shield coil.

5. A coil unit as in claim 2 wherein:

the main coil includes a plurality of channels of main coils and the shield coil includes a plurality of channels of shield coils; and each of the plurality of channels of shield coils has a non-inductive winding configuration with respect to magnetic flux provided by the main coil belonging to the same channel.

6. A coil unit as in claim 2 wherein:

the main coil includes a plurality of channels of main coils and the shield coil includes a plurality of channels of shield coils; and each of the plurality of channels of shield coils has a non-inductive winding configuration with respect to magnetic flux provided by the main coil belonging to a different channel.

7. A coil unit as in claim 2 wherein:

a plurality of channels of main coils and the shield coil includes a plurality of channels of shield coils; and each of the plurality of channels of shield coils has a non-inductive winding configuration with respect to magnetic flux provided by both the main coils belonging to that same channel and, in addition, to a further different channel.

8. A self-shielded magnetic gradient coil unit for magnetic resonance imaging producing three mutually orthogonal X-, Y-, and Z-axes directions of magnetic gradients, the unit comprising:

an X-channel gradient coil assembly for providing a gradient in the X-axis direction;

a Y-channel gradient coil assembly for providing a gradient in the Y-axis direction; and a Z-channel gradient coil assembly for providing a gradient in the Z-axis direction, each of the X-, Y- and Z-channel gradient coil assemblies having a main coil and a shield coil, the main coil of each channel having a first patterned winding formed by a first conductive wire wound on a predetermined main coil pattern, and a shield coil having a second patterned winding formed by a second conductive wire wound on a further predetermined shield coil pattern to reduce leakage from the unit of gradient field provided by the main coil; and at least one of the first and second conductive wires being divided over substantially its entire length into a plurality of branch wires wound into a divided-turn structure having a non-inductive winding configuration with respect to magnetic flux passing through a closed loop formed by the branch wires.

9. A coil unit as in claim 8 wherein the plurality of branch wires are wound around a bobbin in parallel spatial relationship with each other.

10. A self-shielded gradient coil unit as in claim 8 wherein only the shield coil has the divided-turn structure with a non-inductive winding configuration.

11. A coil unit as in claim 10 wherein the number of branch wires is two.

12. A self-shielded gradient coil unit as in claim 10 wherein:

the shield coil of each of the X- and Y-channels has two pairs of second patterned windings arranged face to face around a bobbin of the gradient coil unit;

each of the two pairs of second patterned windings being arranged spatially in series along an axial direction of the bobbin, each of the second patterned windings being formed into a saddle-like winding in which the second conductive wire is wound in a spiral pattern as the predetermined pattern and is directed in opposite ways to each other between the second predetermined windings forming one pair of main and shield windings; and the second conductive wire of each saddle-like winding having said divided-turn structure, the branch wires thereof residing in the spiral pattern being exchanged in relative spatial position between every saddle-like winding constituting each pair of main and shield windings.

13. A self-shielded gradient coil unit as in claim 12 wherein:

one of the branch wires of each of four saddle-like windings constituting two pairs of patterned windings is electrically connected in series with each other;

the other of the branch wires of each of the four saddle-like windings constituting two pairs of patterned windings is electrically connected in series with each other, and these two sets of series-connected branch wires are electrically connected in parallel with each other.

14. A self-shielded gradient coil unit as in claim 10 wherein:

the patterned windings of both the shield coil and the main coil are electrically connected in series and connected to a common power supply.

15. A self-shielded gradient coil unit as in claim 10 wherein:

the shield coil of the Z-channel has a single pair of the second patterned windings arranged in series along an axial direction of the bobbin around which the second conductive wire is wound on a solenoid-like pattern as the predetermined pattern and is directed in opposite ways to each other between the second predetermined windings forming the pair, and the second conductive wire of each patterned winding has the divided-turn structure, the branch wires residing in the solenoid pattern being exchanged in relative spatial positions with regard to the axial direction of the bobbin between the patterned windings constituting each pair of main and shield windings.

16. An MRI (magnetic resonance imaging) system having a self-shielded gradient coil unit producing three mutually orthogonal X-, Y-, and Z-axes directions of magnetic gradients, the system comprising:

a static magnetic field generator, an RF coil;

MRI signal acquisition and processor circuit s connected to MRI signals;

an X-channel gradient coil assembly for providing a gradient in the X-axis direction;

a Y-channel gradient coil assembly for providing a gradient in the Y-axis direction; and a Z-channel gradient coil assembly for providing a gradient in the Z-axis direction, each of the X-, Y- and Z-channel gradient coil assemblies having a main coil and a shield coil, the main coil having a first patterned winding formed by a first conductive wire wound on a predetermined main coil pattern, and the shield coil having a second patterned winding formed by a second conductive wire wound on a further predetermined shield coil pattern to reduce leakage from the gradient coil assemblies of gradient field provided by the main coil; and at least one of the first and second conductive wires being divided, over substantially its entire length into a plurality of branch wires wound into a divided-turn structure having a non-inductive winding configuration with respect to magnetic flux passing through a closed loop formed by the branch wires.

* * * * *